United States Patent
Lai et al.

(10) Patent No.: US 12,166,096 B2
(45) Date of Patent: Dec. 10, 2024

(54) SEMICONDUCTOR DEVICE STRUCTURE WITH UNEVEN GATE PROFILE

(71) Applicant: Taiwan Semiconductor Manufacturing Co., Ltd., Hsin-Chu (TW)

(72) Inventors: Chi-Sheng Lai, Hsinchu (TW); Yu-Fan Peng, Hsinchu (TW); Li-Ting Chen, Hsinchu (TW); Yu-Shan Lu, Hsinchu County (TW); Yu-Bey Wu, Hsinchu (TW); Wei-Chung Sun, Hsinchu (TW); Yuan-Ching Peng, Hsinchu (TW); Kuei-Yu Kao, Hsinchu (TW); Shih-Yao Lin, New Taipei (TW); Chih-Han Lin, Hsinchu (TW); Pei-Yi Liu, Hsinchu (TW); Jing Yi Yan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/301,554

(22) Filed: Apr. 17, 2023

(65) Prior Publication Data
US 2023/0253470 A1 Aug. 10, 2023

Related U.S. Application Data

(62) Division of application No. 17/301,431, filed on Apr. 2, 2021, now Pat. No. 11,631,745.
(Continued)

(51) Int. Cl.
*H01L 29/423* (2006.01)
*H01L 21/8238* (2006.01)
(Continued)

(52) U.S. Cl.
CPC .......... *H01L 29/42376* (2013.01); *H01L 21/823821* (2013.01); *H01L 21/82385* (2013.01);
(Continued)

(58) Field of Classification Search
CPC ............ H01L 29/785; H01L 21/82385; H01L 29/42392; H01L 29/66795;
(Continued)

(56) References Cited

U.S. PATENT DOCUMENTS 7,335,593 B2  2/2008  Arakawa et al.
7,776,755 B2  8/2010  Lin et al.
(Continued)

FOREIGN PATENT DOCUMENTS

CN   105789299 A    7/2016
KR   20150077543 A  7/2015
(Continued)

*Primary Examiner* — Changhyun Yi
(74) *Attorney, Agent, or Firm* — HAYNES AND BOONE, LLP

(57) ABSTRACT

A semiconductor structure includes a semiconductor substrate; fin active regions protruded above the semiconductor substrate; and a gate stack disposed on the fin active regions; wherein the gate stack includes a high-k dielectric material layer, and various metal layers disposed on the high-k dielectric material layer. The gate stack has an uneven profile in a sectional view with a first dimension $D_1$ at a top surface, a second dimension $D_2$ at a bottom surface, and a third dimension $D_3$ at a location between the top surface and the bottom surface, and wherein each of $D_1$ and $D_2$ is greater than $D_3$.

20 Claims, 11 Drawing Sheets

Related U.S. Application Data

(60) Provisional application No. 62/704,570, filed on May 15, 2020.

(51) Int. Cl.
*H01L 27/092* (2006.01)
*H01L 29/06* (2006.01)
*H01L 29/40* (2006.01)
*H01L 29/66* (2006.01)
*H01L 29/78* (2006.01)
*H01L 29/786* (2006.01)

(52) U.S. Cl.
CPC ...... *H01L 27/0924* (2013.01); *H01L 29/0665* (2013.01); *H01L 29/401* (2013.01); *H01L 29/4236* (2013.01); *H01L 29/42392* (2013.01); *H01L 29/66742* (2013.01); *H01L 29/66795* (2013.01); *H01L 29/785* (2013.01); *H01L 29/78642* (2013.01)

(58) Field of Classification Search
CPC ......... H01L 29/78642; H01L 29/66742; H01L 29/4236; H01L 29/42376; H01L 21/823821; H01L 27/0924; H01L 29/0665; H01L 29/401; H01L 21/28114; H01L 29/165; H01L 29/7848; H01L 29/66545
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,912,610 B2 | 12/2014 | Lin et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2016/0111543 A1 | 4/2016 | Fang et al. |
| 2020/0365690 A1* | 11/2020 | Jeong ................ H01L 29/42392 |

FOREIGN PATENT DOCUMENTS

| | | |
|---|---|---|
| KR | 20160104538 A | 9/2016 |
| KR | 20170130327 A | 11/2017 |
| KR | 20190142273 A | 12/2019 |
| TW | 201517272 A | 5/2015 |
| TW | 201926685 A | 5/2015 |
| TW | 202002089 A | 1/2020 |
| TW | 202004864 A | 1/2020 |

\* cited by examiner

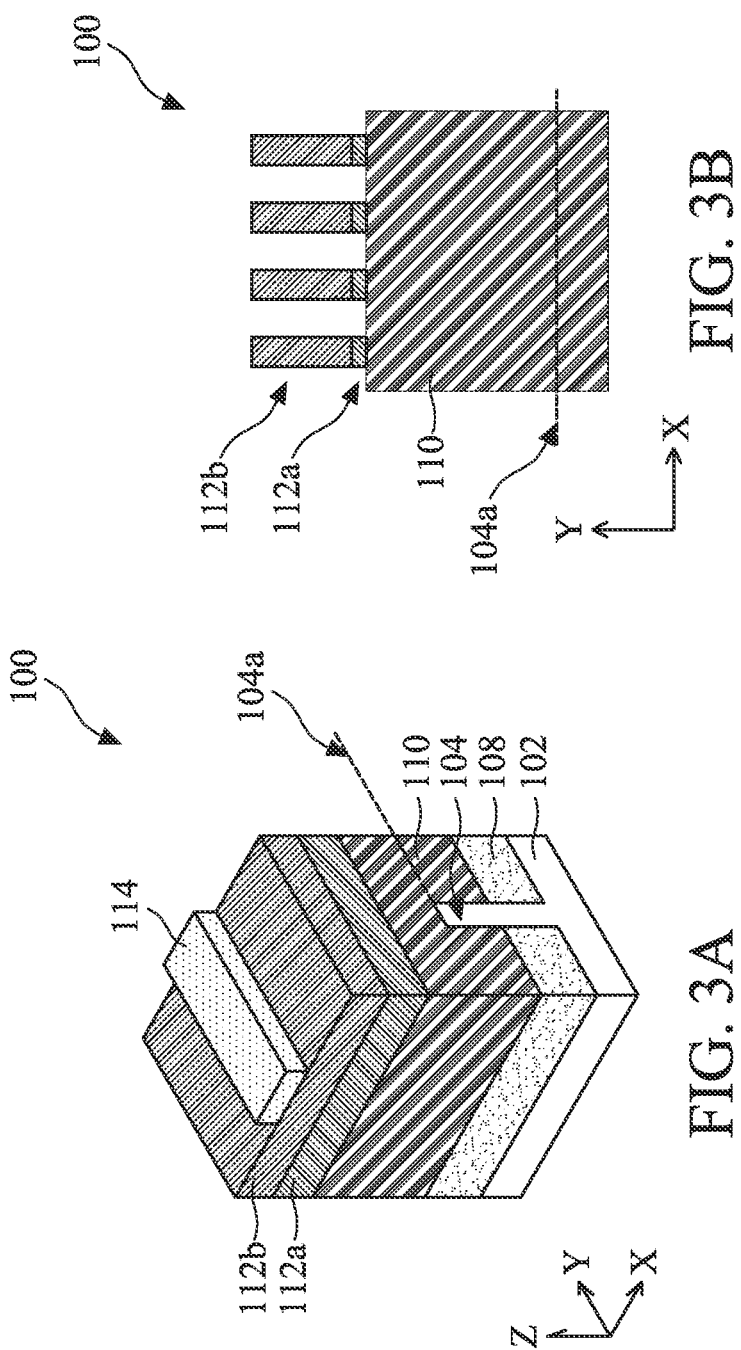

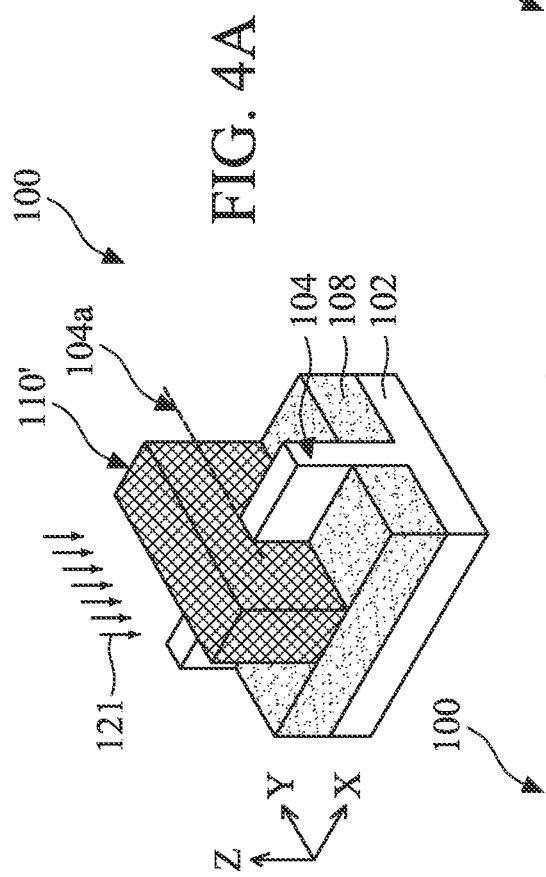
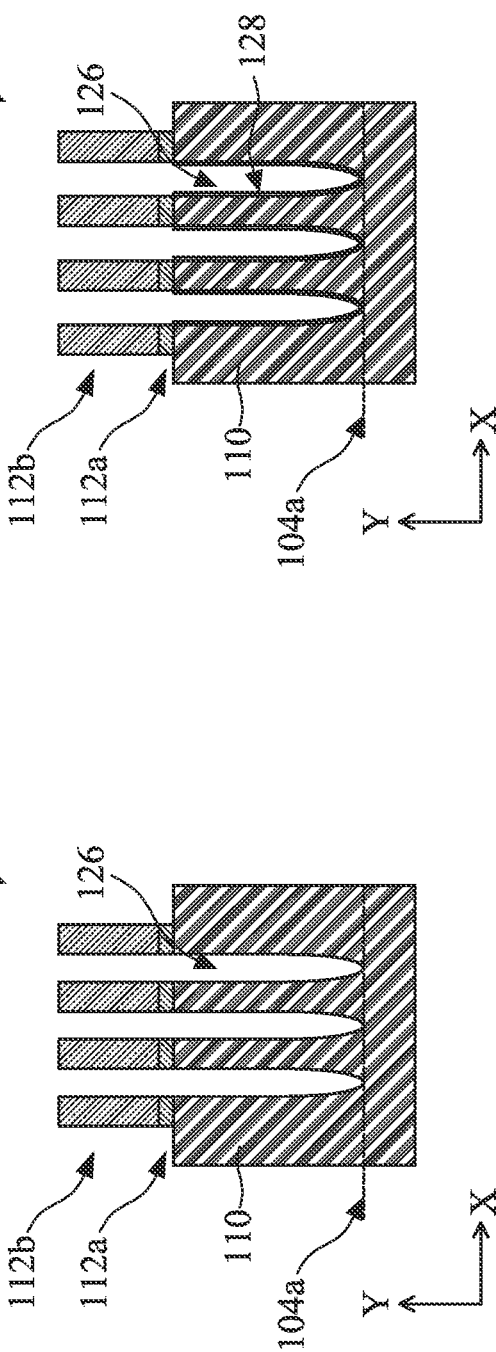

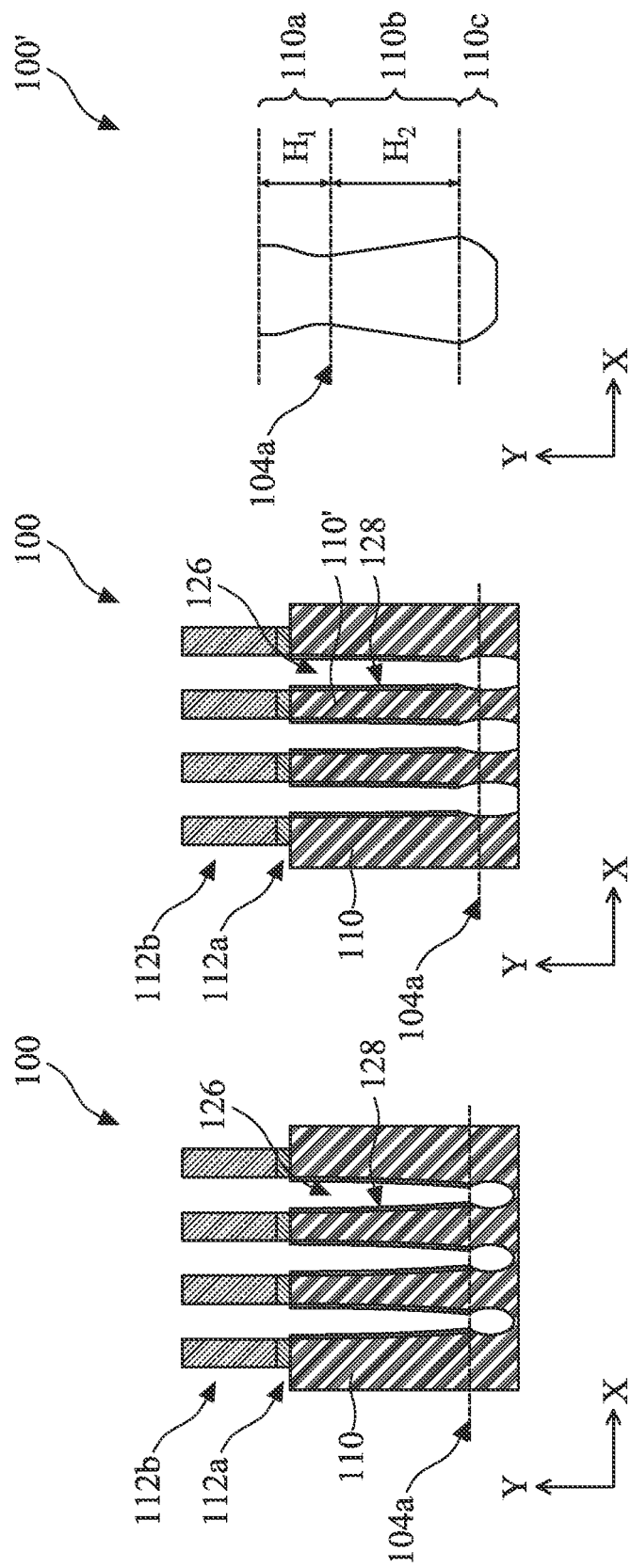

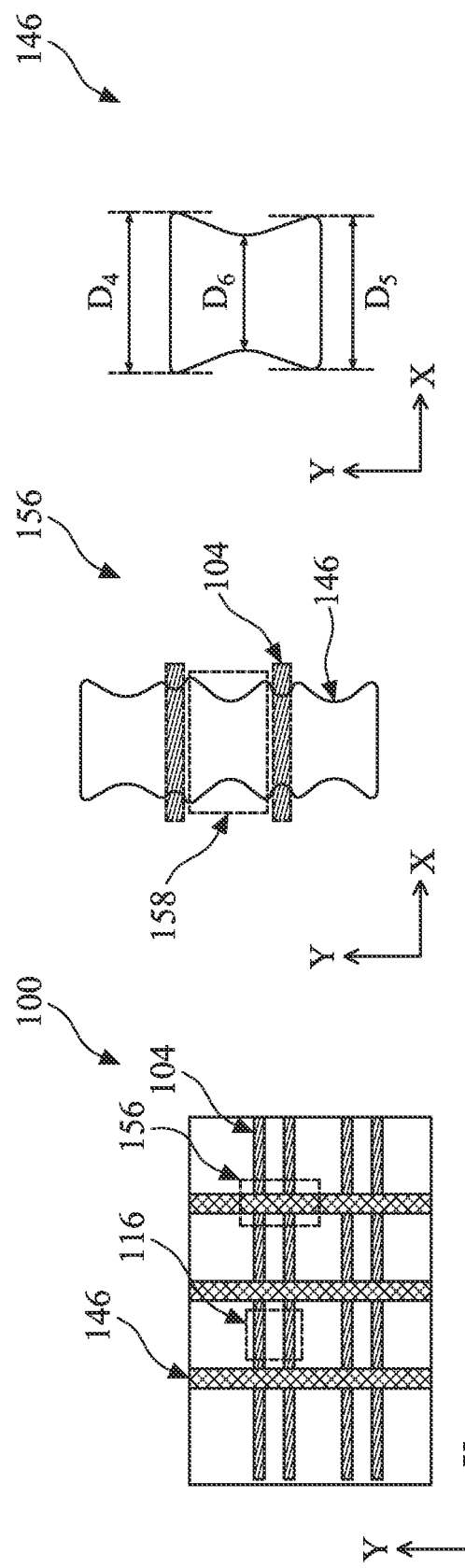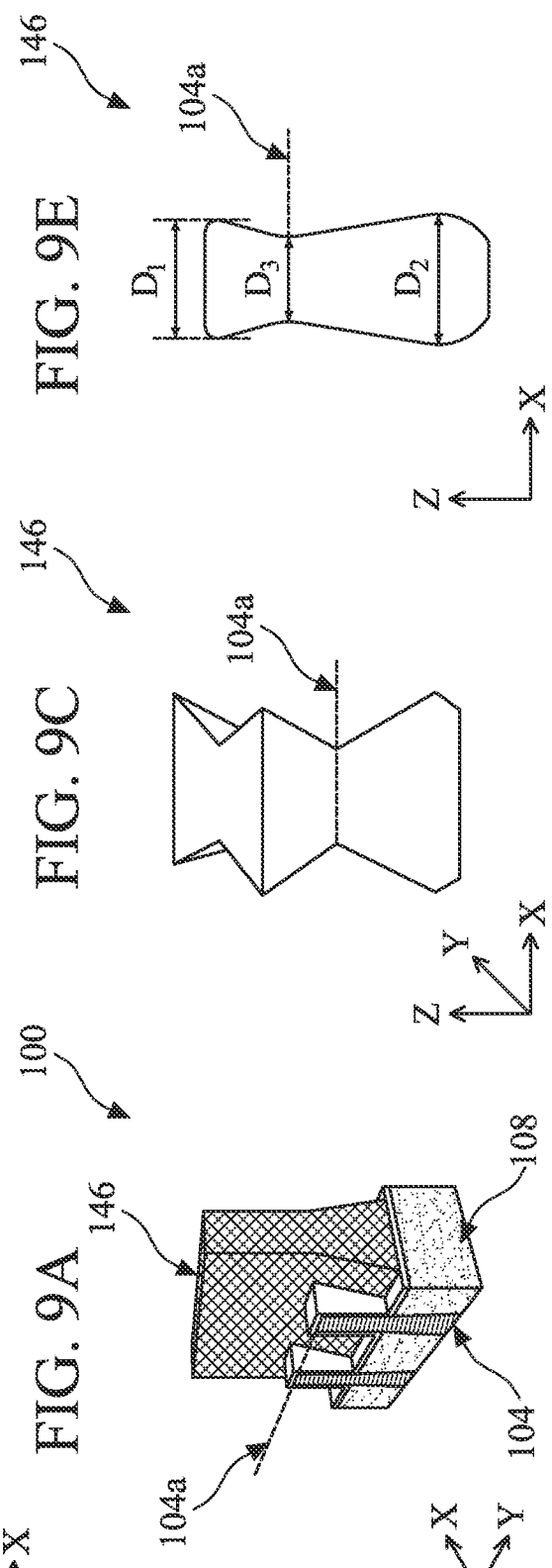

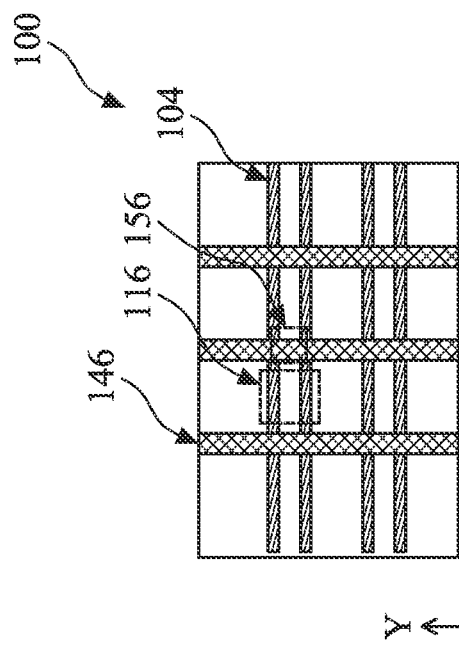
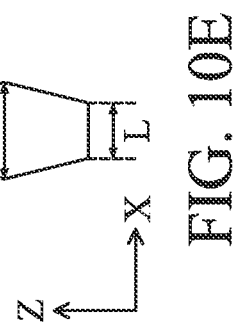
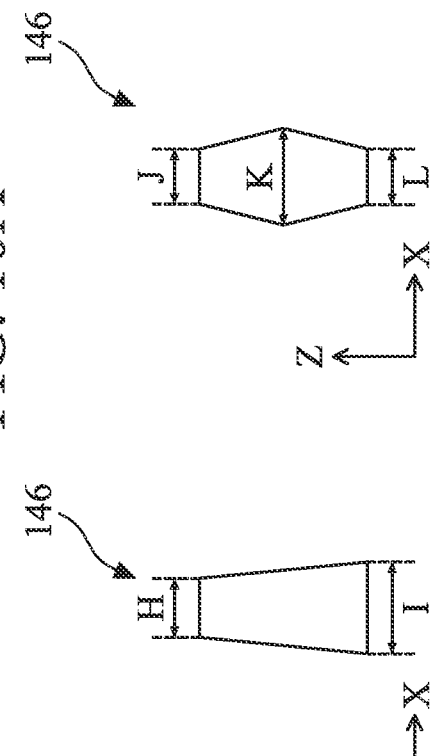
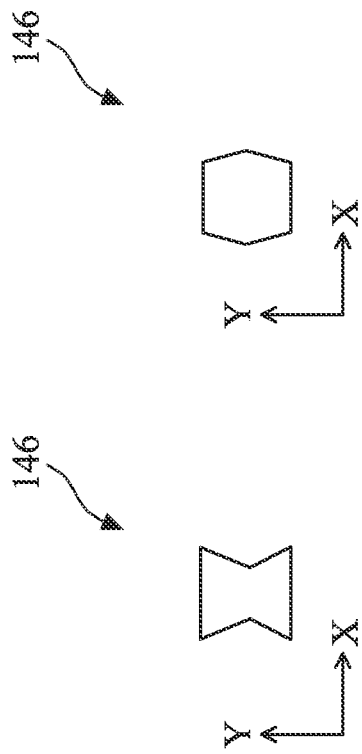
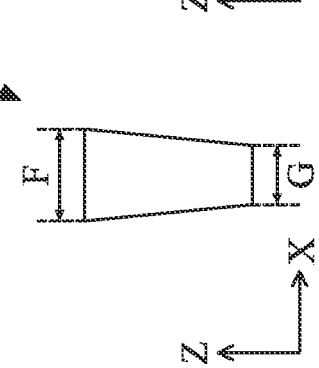
FIG. 10A
FIG. 10B'  FIG. 10C'
FIG. 10B  FIG. 10C  FIG. 10D  FIG. 10E

SEMICONDUCTOR DEVICE STRUCTURE WITH UNEVEN GATE PROFILE

PRIORITY DATA

This application is a Divisional of U.S. patent application Ser. No. 17/301,431, filed Apr. 2, 2021, which further claims priority to U.S. Provisional Patent Application No. 62/704,570 filed on May 15, 2020, entitled "GATE STRUCTURE AND METHOD WITH ENHANCED GATE CONTACT AND THRESHOLD VOLTAGE", the entire disclosures of which are hereby incorporated herein by reference.

BACKGROUND

In advanced technology nodes of integrated circuit industry, high k dielectric material and metal are adopted to form a gate stack of a field-effect transistor (FET) such as a metal-oxide-semiconductor field-effect transistor (MOSFET). In existing methods to form the metal gate stack, metal gates are formed in a gate replacement process that removes dummy gates and fills in the gate trenches with gate materials. Due to high packing density and small feature sizes, it is challenging to achieve proper gap filling and profile control, especially for the FETs with 3D structure, such as 3D fin field effect transistors (FINFETs). Furthermore, device performance and product yield are challenged. Therefore, a structure of a metal gate stack and a method making the same are needed to address the issues identified above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3A and 3B are a perspective and sectional views of the semiconductor structure at a fabrication stage, constructed according to various aspects of the present disclosure in some embodiments.

FIG. 4A is a perspective view of the semiconductor structure, constructed according to various aspects of the present disclosure in some embodiments.

FIGS. 4B, 4C, 4D and 4E are sectional views of the semiconductor structure of FIG. 4A at various fabrication stages, constructed according to various aspects of the present disclosure in some embodiments.

FIG. 4F is a sectional view of the semiconductor structure of FIG. 4E, in portion, constructed according to various aspects of the present disclosure in some embodiments.

FIGS. 9A and 9B are a top and perspective views of the semiconductor structure at a fabrication stage, constructed according to various aspects of the present disclosure in some embodiments.

FIG. 9C is a top view of the semiconductor structure of FIG. 9A, in portion, constructed according to various aspects of the present disclosure in some embodiments.

FIG. 9D is a perspective views of the semiconductor structure of FIG. 9A, in portion, constructed according to various aspects of the present disclosure in some embodiments.

FIGS. 9E and 9F are a top and sectional views of the semiconductor structure of FIG. 9A, in portion, constructed according to various aspects of the present disclosure in some embodiments.

FIG. 10A is a top view of the semiconductor structure, constructed according to various aspects of the present disclosure in some embodiments.

FIGS. 10B, 10C, 10D and 10E are sectional views of the semiconductor structure of FIG. 10A, in portion, constructed according to various aspects of the present disclosure in some embodiments.

FIGS. 10B' and 10C' are top views of the semiconductor structure of FIG. 10A, in portion, constructed according to various aspects of the present disclosure in some embodiments.

DETAILED DESCRIPTION

Figure 2:
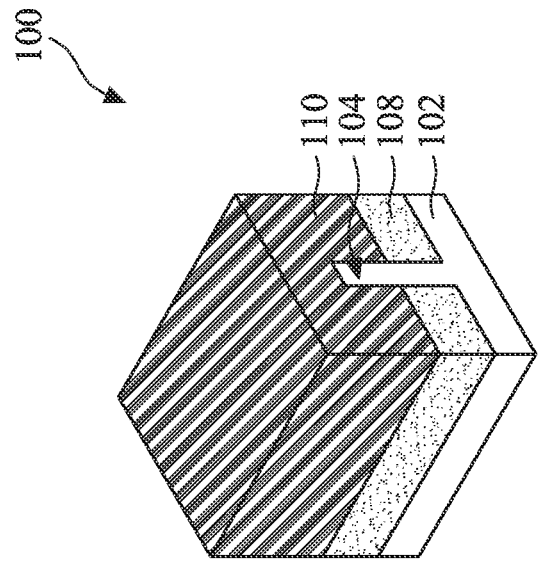
FIGS. 1 and 2 are perspective views of a semiconductor structure at various fabrication stages, constructed according to various aspects of the present disclosure in some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower." "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure provides various embodiments of a semiconductor structure having fin active regions and field-effect transistors (FETs) formed on the fin active regions, those transistors are also referred to fin FETs (FinFETs). Especially, the semiconductor structure with FinFETs includes a gate stack having an uneven sectional and top views. More specifically, the gate stack includes a segment in a spacing between two adjacent fin active regions and the segment of the gate stack has a hourglass shape in in a sectional view and a gourd shape in a top view. The present disclosure also provides a method fabricating the same in accordance with some embodiments. The disclosed semiconductor structure and the method making the same provide better gate filling window, production yield gain and device performance enhancement, including reduced parasitic capacitance, and gate control enhancement.

Figure 11:
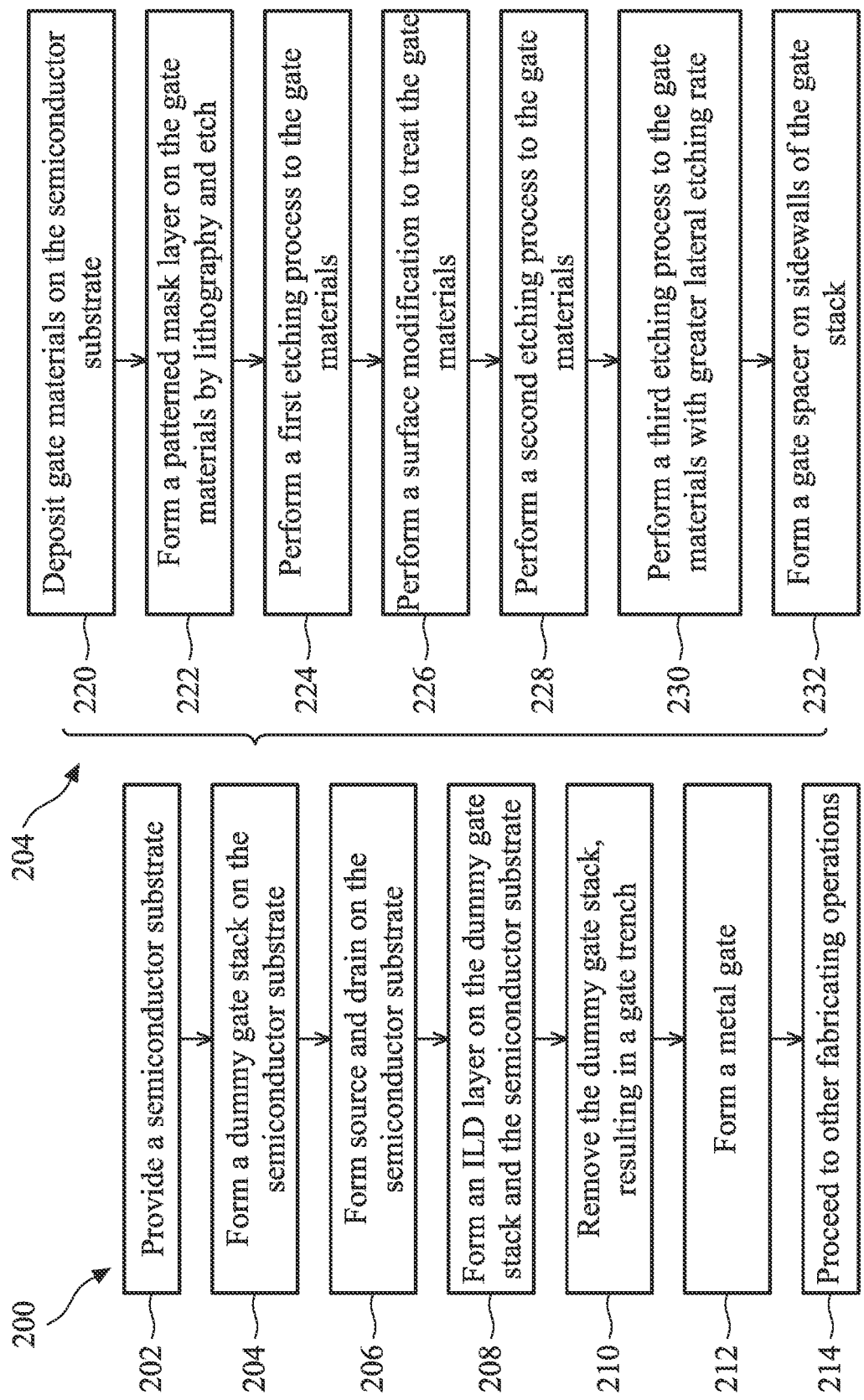
FIG. 11 is a flowchart of a method fabricating the semiconductor structure in accordance with some embodiments.
Figure 12A:
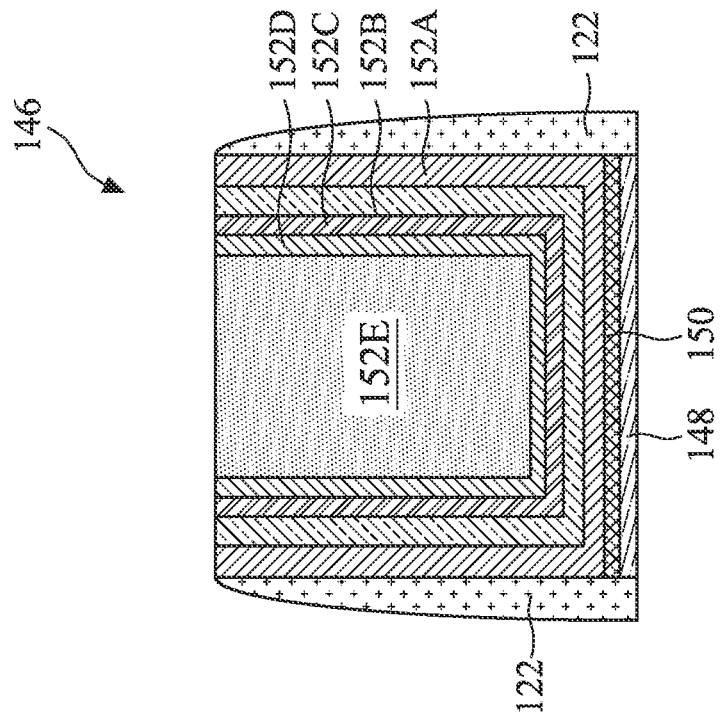
FIGS. 12A and 12B illustrate sectional views of a gate stack of FIG. 9A, constructed in accordance with some embodiments.
Figure 12B:
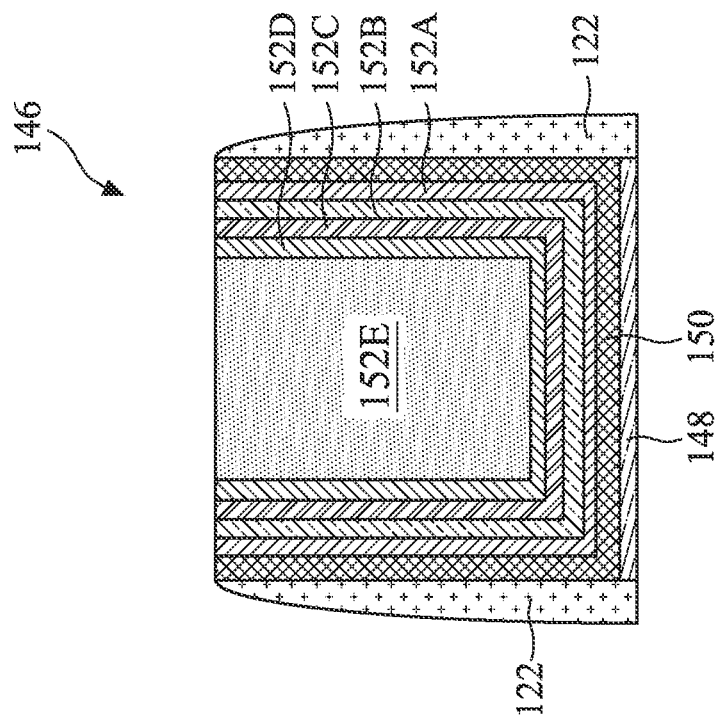
Figure 13:
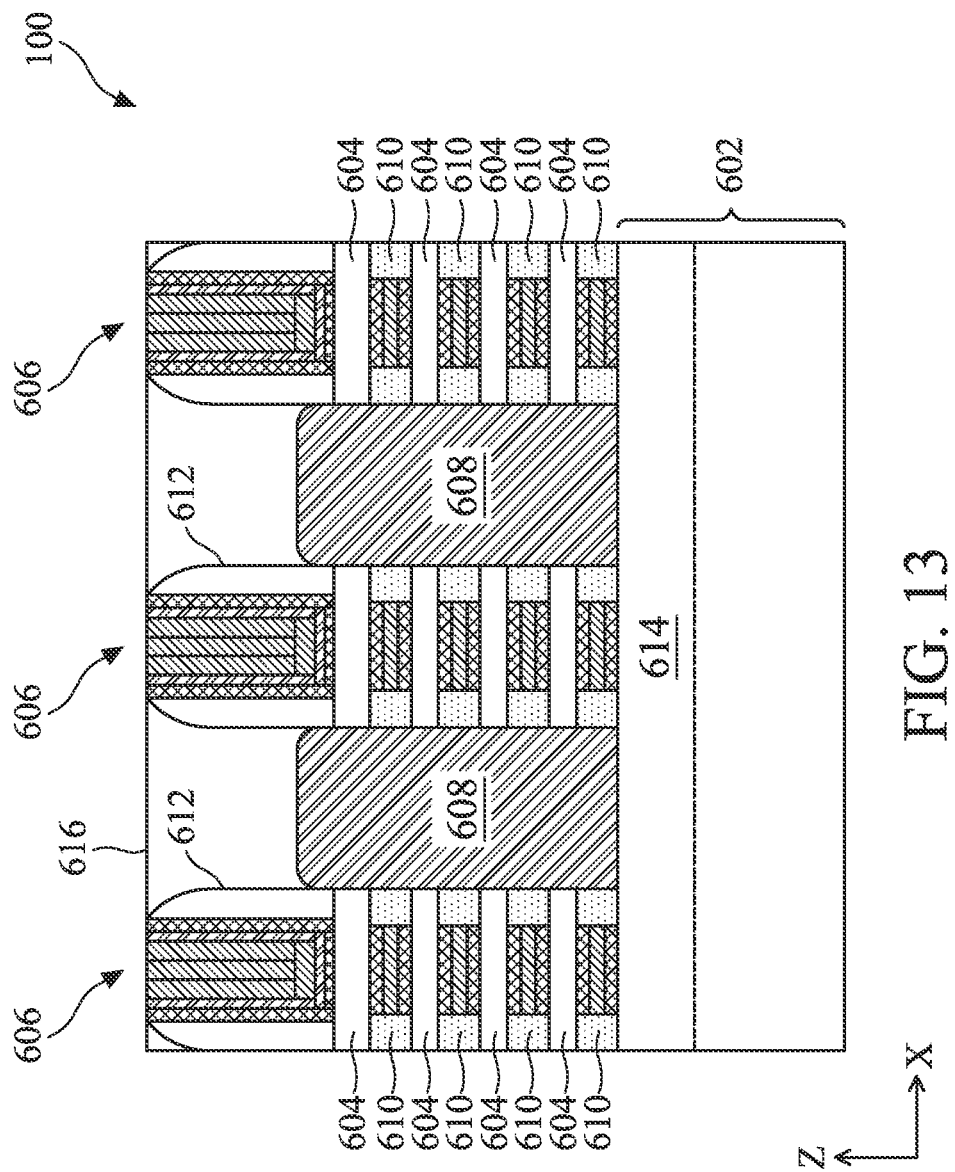
FIG. 13 is a sectional view of the semiconductor structure, constructed according to various aspects of the present disclosure in some embodiments.

FIGS. 1 through 10E are perspective, sectional, top views of a semiconductor structure 100 at various fabrication stages, constructed in accordance with some embodiments. FIG. 11 is a flowchart of one embodiment of a method 200 making the semiconductor structure 100. FIGS. 12A and 12B are sectional views of the gate stack in the semiconductor structure 100, constructed in accordance with various embodiments. FIG. 13 is a sectional view of a semiconductor structure 100, constructed in accordance with some embodiments. The semiconductor structure 100 and the method 200 making the same are collectively described with reference to FIGS. 1 through 13.

The method 200 begins at 202 by providing a semiconductor structure 100 having a semiconductor substrate 102. The semiconductor substrate 102 includes silicon. Alternatively, the semiconductor substrate 102 includes germanium or silicon germanium. In other embodiments, the semiconductor substrate 102 may use another semiconductor material such as diamond, silicon carbide, gallium arsenic, GaAsP, AlInAs, AlGaAs, GaInP, or other proper combination thereof.

The semiconductor substrate 102 also includes various doped regions such as n-well and p-wells formed by a proper technique, such as ion implantation. The semiconductor substrate 102 also includes various isolation features 108, such as shallow trench isolation (STI) features, formed in the substrate to define active regions 104 and separating various devices on the active regions. The formation of the STI features may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI features may be created using a processing sequence such as: growing a pad oxide, forming a low pressure chemical vapor deposition (LPCVD) nitride layer, patterning the substrate to form a trench using photoresist and masking, etching a trench in the substrate, optionally growing a thermal oxide trench liner to improve the trench interface, filling the trench with silicon oxide by chemical vapor deposition (CVD), and using chemical mechanical planarization (CMP) to polish and planarize.

In some embodiments, the top surface of the semiconductor substrate 102 and the top surfaces of the STI features 108 are substantially coplanar, resulting in a common top surface. This is referred to as a planar structure. In some embodiments, the top surface of the semiconductor substrate 102 and the top surfaces of the STI features 108 are not coplanar, resulting in a three-dimensional structure, such as a fin structure 104 in a semiconductor structure 100 illustrated in FIG. 1. In the semiconductor structure 100, the active region 104 is extended above the top surface of the STI features 108 and therefore is referred to as the fin structure or fin active region. Thus, various devices are formed on the fin structure 104. Particularly, a field effect transistors (FET) is formed on the fin structure 104 and the corresponding gate of the FET is coupled with the channel from the multiple surfaces (top surface and sidewalls) of the fin structure, thus enhancing the device performance. Accordingly, a FET formed on the fin structure 104 is referred to as a FinFET.

The disclosed semiconductor structure 100 and the method 200 making the same provide improvements to integrated circuits, especially to the FinFET. The fin structure 104 may be formed by various techniques. In some embodiments, the fin structure 104 is formed by recessing the STI features 108, such as by selective etching. In some other embodiments, the fin structure 104 is formed by selective epitaxy growth (SEG). In the SEG process, the fin structure 104 is formed with a semiconductor material same to that of the substrate 102 (such as silicon) or alternatively different (such as silicon germanium or silicon carbide) to further achieve other functions (e.g., straining effect). The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 1:
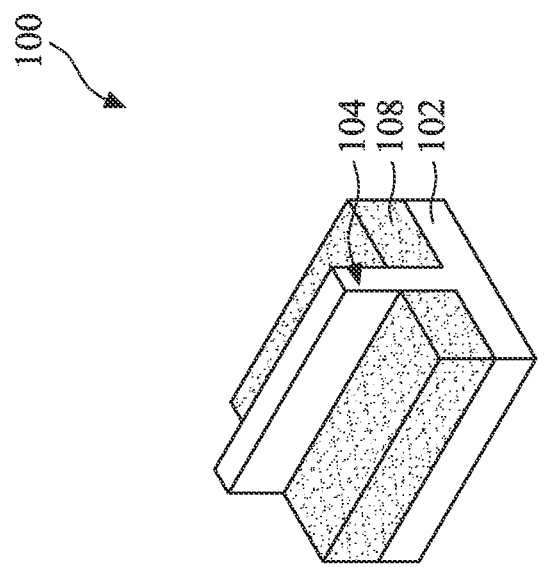

Still referring to FIG. 1, various doped wells may be formed in one or more fin active regions 104. In some embodiments, a fin active region 104 is designed to form a FET, such as a p-type FET (pFET) or an n-type FET (nFET). In some examples, a pFET is to be formed on the fin active region 104, and the doped well includes an n-type dopant, such as phosphorous (P). In some other examples, an nFET is to be formed on the fin active region 104, and the doped well includes a p-type dopant, such as boron (B), distributed in an active region. The dopant may be introduced to the doped well through an opening of the mask layer by a suitable doping process, such as one or more ion implantation. The STI features 108 further functions to define the dopants to the desired active regions. In some embodiments, both nFETs and pFETs are formed on the substrate 102, such as in complimentary metal-oxide-semiconductor (CMOS) circuits.

The method 200 proceeds to an operation 204 by forming one or more gate stack 110' on the semiconductor substrate 102. Since the gate stack 110' is to be replaced by a metal gate stack at later stage and therefore is also referred to as dummy gate stack 110'. The gate stack 110' may include a gate dielectric layer and a gate conductive layer. The formation of the dummy gate stack 110' includes deposition of dummy gate material(s) 110 and patterning the dummy gate material(s) 110. The patterning further includes lithography process and etching. A hard mask layer may be further used to pattern the gate material 110. Especially, the disclosed method 200 forms the gate stack 110' with a particular gate profile (including shape, dimensions and ratios) for enhanced device performance and increased yield. The operation 204 includes multiple processing steps (or sub-operations) 220-232 and is further described below in detail in accordance with some embodiments.

Referring to FIG. 2, the method 200 includes an operation 220 to deposit one or more gate material layer (or gate material) 110 on the fin active regions 104 and the STI features 108. The top surface of the fin active regions 104 is referred by a numeral 104a, which is above the top surface of the STI features 108. The gate material layer 110 is deposited on the fin active regions 104 and the STI features 108 and is extended above the top surface 104a of the fin active regions 104. In the depicted embodiment, the gate material layer 110 includes a polysilicon layer, or alternatively include a silicon oxide layer and a polysilicon layer on the silicon oxide layer. The silicon oxide layer may be formed by thermal oxidation and the polysilicon layer may be formed by a suitable deposition, such as CVD, flowable CVD (FCVD). In one example, the polysilicon layer is non-doped. In another example, the polysilicon layer has a thickness ranging between about 500 Angstrom and about 1000 Angstrom. A chemical mechanical polishing (CMP) process may be applied to planarize the top surface after the deposition.

Referring to FIGS. 3A and 3B, the method 200 may include an operation 222 to form a patterned mask layer 112 on the gate material layer 110 by deposition and lithography process. The patterned mask layer 112 is used as an etch mask for patterning the gate material layer 110. The patterned mask layer 112 defines various gate regions and includes various openings that expose portions of the gate material layer 110 to be removed. The patterned mask layer 112 includes a hard mask, such as one or more dielectric material, or alternatively a soft mask, such as photoresist. In the depicted embodiment, the patterned mask layer 112 is used and includes a silicon nitride film 112a and a silicon oxide film 112b on the silicon nitride film 112a, 112a and 112b being collectively referred by the numeral 112. As one example, the silicon nitride film 112a and the silicon oxide film 112b may be deposited on the polysilicon layer by a low pressure chemical vapor deposition (LPCVD) process or other suitable deposition. The silicon nitride and silicon oxide layers are further patterned using a patterning procedure. The patterning procedure may include a photolithography process to form a patterned photoresist layer 114 (as illustrated in FIG. 3A) and an etching process to etch the silicon oxide film 112b and the silicon nitride film 112a within the openings of the patterned photoresist layer 114, thereby forming the patterned mask layer 112, as illustrated in FIG. 3B. An exemplary photolithography process may include processing steps of photoresist coating, soft baking, mask aligning, exposing, post-exposure baking, developing photoresist and hard baking. The photolithography exposing process may also be implemented or replaced by other proper methods such as mask-less photolithography, electron-beam writing, ion-beam writing, and molecular imprint. The patterned photoresist layer 114 may be removed after the formation of the patterned mask layer 112 by a suitable method, such as wet stripping or plasma ashing. It is noted that FIG. 3A only illustrates the patterned photoresist layer 114 with one exemplary rectangle feature while the patterned mask layer 112 includes four exemplary features. Those are only for illustration not intended for limiting. Similar exemplary features are illustrated in following figures without limiting.

Referring to FIG. 4A, the method 200 further includes patterning the gate material layer 110 to form the gate stack 110'. One or more etching process is applied to the gate material layer 110 through the openings of the patterned mask 112. The etching process may include dry etching, wet etching, other suitable etching or a combination thereof. The method 200 includes a patterning procedure 121 that further includes multiple etching steps and a surface modification process designed to pattern the gate material 110 and to form the gate stack 110' with a gate profile with desired geometry, dimensions, and dimensional ratios, as illustrated in FIGS. 4A-4F and the other figures. After the gate replacement, the final metal gate stack carries the gate profile including geometry, dimensions, and dimensional ratios. FIG. 4F is a sectional view of the gate stack 110'. The gate stack 110' includes an hourglass shape as illustrated in FIG. 4F. More particularly, the gate stack 110' includes an upper portion 110a above the top surface 104a of the fin active region 104, and a middle portion 110b and a lower portion 110c below the top surface of the fin active region 104. The upper portion 110a of the gate stack 110' has a height $H_1$ ranging from 100 nm to 150 nm, and spans a first width ranging from 10 nm to 20 nm. The middle portion 110b of the gate stack 110' has a height $H_2$ ranging from 40 nm to 80 nm, and spans a second width ranging from 10 nm to 20 nm at the bottom and a third width ranging from 10 nm to 15 nm at the top. The lower portion 110c of the gate stack 110' has a height $H_3$ ranging from 20 nm to 40 nm. In some embodiments, the ratio $H_1/H_2$ ranges between 2.5 and 3.5 and the ratio $H_2/H_3$ ranges between 1.5 and 2. The minimum width of the gate stack 110' is located at the interface between the upper portion 110a and the middle portion 110b of the gate stack 110'. The gate stack 110' and the patterning procedure 121 that includes various etching processes (such as 224, 228 and 230) and surface modification (such as 226) are further described below, with reference to FIGS. 4B, 4C, 4D and 4E. FIGS. 4B, 4C, 4D and 4E are sectional views of the semiconductor structure 100 cut along the X direction on the STI features 108 at various fabrication stages. Therefore, the gate material layer 110 includes some portions above and other portions below the top surface 104a of the fin active regions 104, as illustrated in FIG. 4A.

Referring to FIG. 4B, the method 200 includes an operation 224 by performing a first etching process to the gate material layer 110, resulting in trenches 126 formed in the gate material layer 110. In the depicted embodiment, the first etching process at the operation 224 applies a first etchant including sulfur dioxide ($SO_2$) and hydrogen ($H_2$). In furtherance of the embodiment, the first etchant includes oxygen ($O_2$), $SO_2$, nitrogen ($N_2$), and $H_2$. The first etching process includes a gas pressure ranging between 10 atm and 500 atm; an etching temperature ranging between 10° C. and 120° C.; etching plasma power ranging between 5 W and 1500 W; and a carry gas of argon (Ar). The first etching process is controlled to etch the upper portion of gate material layer 110 above the top surface 104a of the fin active regions 104, which may be controlled by etching duration or other suitable end-point control method.

Referring to FIG. 4C, the method 200 includes an operation 226 by performing a surface modification process to the sidewalls of the gate material layer 110 in the trenches 126. The surface modification process is designed to modify the surface characteristics of the gate material layer 110 (e.g., polysilicon in the present embodiment), thereby forming a treated surface layer 128 of the gate material layer 110. More particularly, the surface modification process is designed to modify the surfaces of the gate material layer 110 such that it is resistant to (or not susceptible to) the subsequent etching process. In the depicted embodiment, the surface modification process introduces carbon (C), nitrogen ($N_2$), or both into the sidewall surface of the gate material layer 110 in the trenches 126 by ion implantation, thereby forming the treated surface layer 128. In the present embodiment, the treated surface layer 128 includes silicon and at least one of carbon and nitrogen. In some examples, the treated surface layer 128 includes silicon, carbon and nitrogen. In some embodiment, the treated surface layer 128 has a thickness ranging between 0.5 nm and 1 nm. In some embodiment, the concentrations of $N_2$ and carbon in the treated surface layer 128 are controlled by partial pressure of the corresponding gas during the ion implantation, such as $N_2$ with a partial pressure ranging from 5 mt (mTorr) to 10 mt and carbon-containing gas with a partial pressure ranging from 20 mt to 50 mt, thereby forming $CF_4$. In yet some embodiment, the ion implantation in the operation 226 is implemented with a total gas pressure ranging from 200 mt to 500 mt, and a power ranging from 5 W to 1500 W. In some embodiments, the precursor in the ion implantation includes HBr, Cl, $N_2$, $NF_3$, and $CF_4$. In the depicted embodiment, the treated surface layer 128 extends on the sidewalls of the gate material layer 110 from the top surface of the gate material layer 110 down to a level matching the top surface 104a of the fin active regions 104.

Referring to FIG. 4D, the method 200 includes an operation 228 by performing a second etching process to the gate material layer 110. The second etching process is different from the first etching process since the second etching process uses different etchant and is applied after the operation 226 of the surface modification process. The second etching process at the operation 228 applies a second etchant including hydrogen bromide (HBr), chlorine (Cl) and fluorine (F). In furtherance of the embodiment, the second etchant includes HBr, $Cl_2$, $O_2$, $N_2$, nitrogen-fluorine ($NF_3$), and fluorocarbon ($CF_4$). The etchant of the second etching process is designed to selectively etch the gate material layer 110 while it substantially does not etch (or with minimal etch effect) to the treated surface layer 128. In some embodiments, the etchant of the second etching process includes Br, Cl and F while the treated surface layer 128 includes Br, Cl and F as well, thereby increasing the etching resistance of the treated surface layer 128 to the second etching process. In some examples, the second etching process includes a gas pressure ranging between 10 mt and 500 mt; an etching temperature ranging between 10° C. and 120° C.; etching plasma power ranging between 5 W and 1500 W; and a carry gas of argon (Ar). In some examples, the second etching process includes gas flow rates: HBr flow rate ranging between 10 and 1200 sccm, $Cl_2$ flow rate ranging between 10 sccm and 800 sccm, $O_2$ flow rate ranging between 10 sccm and 800 sccm, $N_2$ flow rate ranging between 10 sccm and 800 sccm, $NF_3$ flow rate ranging between 10 sccm and 800 sccm, and $CF_4$ flow rate ranging between 10 sccm and 200 sccm. The second etching process extends the trenches 126 below the top surface 104a of the fin active regions 104. The second etching process is controlled to etch the lower portions of gate material layer 110 below the top surface 104a of the fin active regions 104.

At the operation 228, the treated surface layer 128 is first broken through at the bottom so that the second etching process can etch to the lower portions of the gate material layer 110 below the top surface 104a. This can be achieved by designing the second etching process with directional etching effect toward the bottom. For example, the second etching process is designed with bias power greater enough to break through the treated surface layer 128 at the bottom without (or minimal) effect to the treated surface layer 128 on the sidewalls of the gate material layer 110. In some embodiments, the second etching process has a bias power P2 being greater than 50 W or ranging from 50 W to 1500 W.

During the second etching process, the upper portion of the gate material layer 110 is protected by the treated surface layer 128, which is resistant to the second etching process. Thus, the second etching process etches down into the lower portion of the gate material layer 110 below the top surface 104a with no (or minimum) etching effect to the upper portion of the gate material layer 110, as illustrated in FIG. 4D.

Referring to FIG. 4E, the method 200 includes an operation 230 by performing a third etching process to the gate material layer 110, forming gate stacks 110'. The third etching process is designed to have lower bias power and a higher lateral etching rate than those of the first and second etching processes. Particularly, the bias power P3 of the third etching process is substantially lower than the bias power P2 of the second etching process, such as P3 being below 50 W or ranging between 5 W and 45 W. In some embodiments, a ratio of P2/P3 ranges between 10 and 30. The third etching process applies a third etchant similar to the second etchant but with a lower bias power. In some embodiments, the third etchant includes hydrogen bromide (HBr), chlorine (Cl) and fluorine (F). In furtherance of the embodiment, the third etchant includes HBr, $Cl_2$, $O_2$, $N_2$, nitrogen-fluorine ($NF_3$), and fluorocarbon ($CF_4$). In some examples, the third etching process includes a gas pressure ranging between 10 mt and 500 mt; an etching temperature ranging between 10° C. and 120° C.; etching plasma power ranging between 5 W and 1500 W; and a carry gas of argon (Ar). In some examples, the third etching process includes gas flow rates: HBr flow rate ranging between 10 and 1200 sccm, $Cl_2$ flow rate ranging between 10 sccm and 800 sccm, $O_2$ flow rate ranging between 10 sccm and 800 sccm, $N_2$ flow rate ranging between 10 sccm and 800 sccm, $NF_3$ flow rate ranging between 10 sccm and 800 sccm, and $CF_4$ flow rate ranging between 0 sccm and 200 sccm. The third etching process is designed to laterally enlarge the trenches 216 in the portions of gate material layer 110 below the top surface 104a of the fin active regions 104, thereby forming the gate stacks 110' with an uneven profile.

During the third etching process, the upper portion of the gate material layer 110 is protected by the treated surface layer 128, the third etching process has limited etching effect to the upper portion of the gate material layer 110 and has enhanced lateral etching effect to the lower portions of the gate material layer 110, causing the trenches 126 with maximum lateral etching at the location leveling to the top surface 104a of the fin active regions 104. This is because the gate material at the level 104a has experienced more lateral etching in the trench 126 at the level 104a between the upper portion 110a and middle portion 110b, which behaviors like the top opening during the second and third etching processes since the upper portion of the gate material layer 110 is substantially protected from etching by the treated surface layer 128. Thus, the trench 126 has a profile with a maximum width at the location leveling to the top surface 104a of the fin active region 104. Accordingly, the gate stack 110' includes an hourglass shape as illustrated in FIG. 4F. The gate stack 110' in FIG. 4F is present directly on the STI features 108 as illustrated in FIG. 4A.

Figure 5:
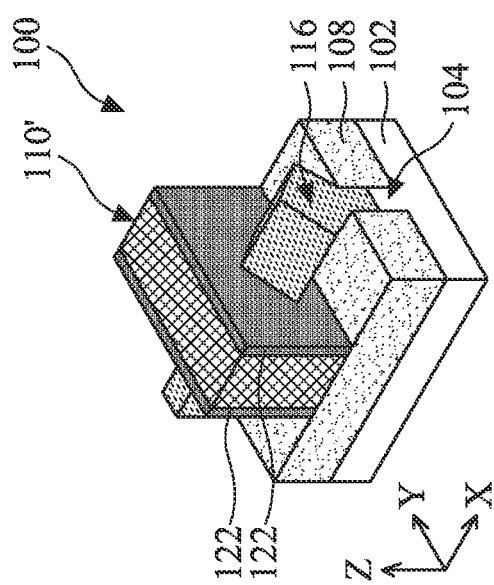
FIG. 5 is a perspective view of the semiconductor structure at a fabrication stage, constructed according to various aspects of the present disclosure in some embodiments.

Referring to FIG. 5, the method 200 includes an operation 232 to form gate spacer 122 on the sidewall of the gate stack 110'. The gate spacer 122 includes one or more dielectric material, such as silicon oxide, silicon nitride, silicon oxynitride, other suitable dielectric material, or a combination thereof. The gate spacer 122 is formed by deposition (such as CVD) and anisotropic etch (such as plasma etching).

Still referring to FIG. 5, the method 200 includes an operation 206 to form source and drain (S/D) features 116 on the fin active region 104. The S/D features 116 are formed on the fin active region 104 and interposed by the gate stack 110'.

In some examples, the S/D features 116 include doping species introduced to the fin active region 104 by a proper technique, such as ion implantation. In one embodiment, the gate stack 110' is configured in the active region for a n-type field effect transistor (nFET), the dopant of the S/D features 116 is n-type dopant, such as phosphorus or arsenic. In another embodiment, the gate stack 110' is configured in the active region for a p-type field effect transistor (pFET), the dopant of the S/D features 116 is p-type dopant, such as boron or gallium. In yet another embodiment, the S/D features 116 include light doped drain (LDD) features and heavily doped S/D features, collectively referred to as S/D features or simply source and drain 116. The LDD features and heavily doped S/D features may be formed by respective ion implantations. One or more thermal annealing process is followed to activate the doped species.

In some embodiments, the S/D features 116 are formed by epitaxy growth to enhance device performance, such as for strain effect to enhance mobility. In furtherance of the embodiments, the formation of the S/D features 116 includes selectively etching the fin 104 in S/D region to form the recesses; and epitaxy growing one or more semiconductor material in the recesses to form the S/D features 116. The recesses may be formed using wet and/or dry etch process to selectively etch the semiconductor material of the fin active region 104. In furtherance of the embodiments, the gate stack 110', the gate spacers 122, and the STI features 108 collectively function as an etching hard mask, thereby forming the recesses in the S/D regions. In some examples, an etchant such as carbon tetrafluoride ($CF_4$), chlorine ($Cl_2$), other suitable etchant, or a combination thereof is used to form the recesses.

Thereafter, the recesses are filled with a semiconductor material by epitaxially growing S/D features 116 in crystalline structure. The epitaxy growth may include in-situ doping to form S/D with proper dopant. In some embodiments, the epitaxy growth is a selective deposition process that involves etching during the epitaxy growth, such that the semiconductor material is substantially grown on the semiconductor surfaces in the recess. Particularly, the selective deposition process involves chlorine for etching effect and makes the deposition selective. The selective deposition process is designed and tuned to epitaxially grow such that the S/D features 116 formed in the recesses include the semiconductor material in a crystalline structure. The semiconductor material of the S/D features 116 may be different from that of the fin active region 104. For example, the semiconductor material of the S/D features 116 includes silicon carbide or silicon germanium while the fin active region 104 are silicon features. In some embodiments, the semiconductor material of the S/D features 116 is chosen for proper strained effect in the channel region such that the corresponding carrier mobility is increased. In one example, the active region 104 is configure for a pFET, the semiconductor material of the S/D features 116 is silicon germanium doped with boron while the fin active region 104 is a silicon feature. In another example, the active region 104 is configured for an nFET, the semiconductor material of the S/D features 116 is silicon carbide doped with phosphorous while the fin active region 104 is a silicon feature.

In yet another embodiment, silicide features may be further formed on the S/D features 116 to reduce the contact resistance. The silicide features may be formed by a technique referred to as self-aligned silicide (salicide) including metal deposition (such as nickel deposition) onto a silicon substrate, a thermal anneal to react the metal with silicon to form silicide, and an etch to remove un-reacted metal.

Figure 6A:
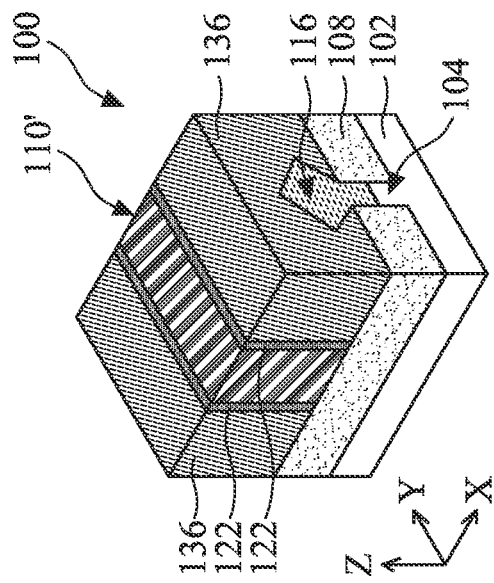
FIGS. 6A and 6B are a perspective and sectional views of the semiconductor structure at a fabrication stage, constructed according to various aspects of the present disclosure in some embodiments.
Figure 6B:
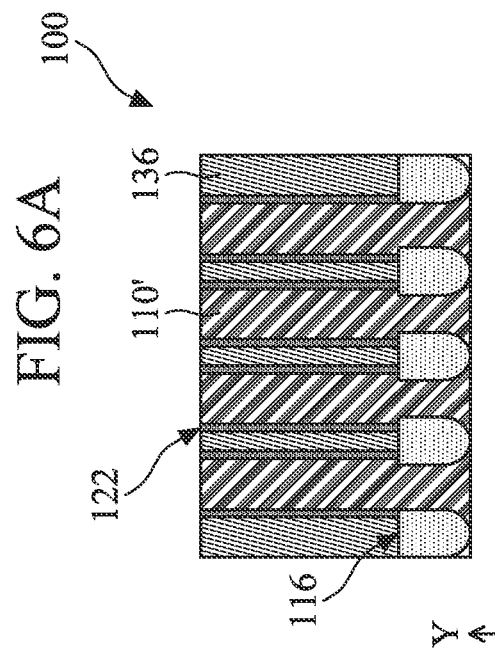

Referring to FIGS. 6A and 6B, the method 200 proceeds to an operation 208 by forming an interlayer dielectric (ILD) layer 136 on the substrate and the gate stack 110'. The ILD 136 is deposited by a proper technique, such as CVD, flowable CVD (FCVD), or other suitable deposition method. The ILD layer 136 includes one or more dielectric material, such as silicon oxide, low-k dielectric material or a combination. Then a chemical mechanical polishing (CMP) process may be applied thereafter to planarize the surface of the ILD layer 136. In one example, the gate stack 110' is exposed by the CMP process for the subsequent processing steps. In another example where the hard mask used to pattern the gate stack 110' is not removed at the previous operation, the CMP process removes the hard mask as well. Alternatively, the CMP process stops on the hard mask and the hard mask is removed thereafter by an etch process.

Figure 7:
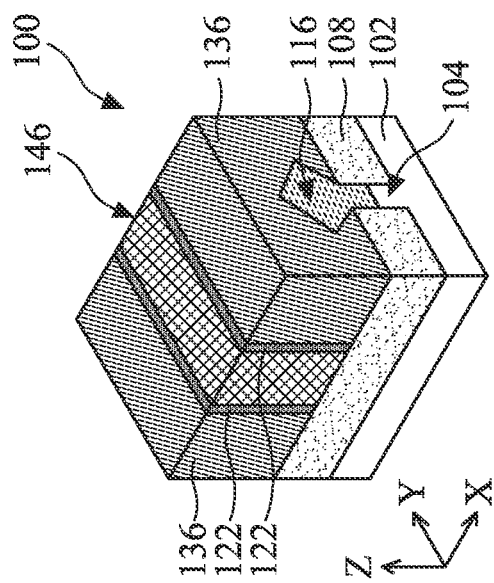
FIG. 7 is a sectional view of the semiconductor structure at a fabrication stage, constructed according to various aspects of the present disclosure in some embodiments.

Referring to FIG. 7, the method 200 proceeds to an operation 210 by removing the gate stack 110' partially or completely, resulting in a gate trench 142. The operation 210 includes one or more etching steps to selectively remove the gate electrode layer or alternatively the gate stack 110' by a suitable etching process, such as one or more wet etch, dry etch or a combination thereof.

Figure 8A:
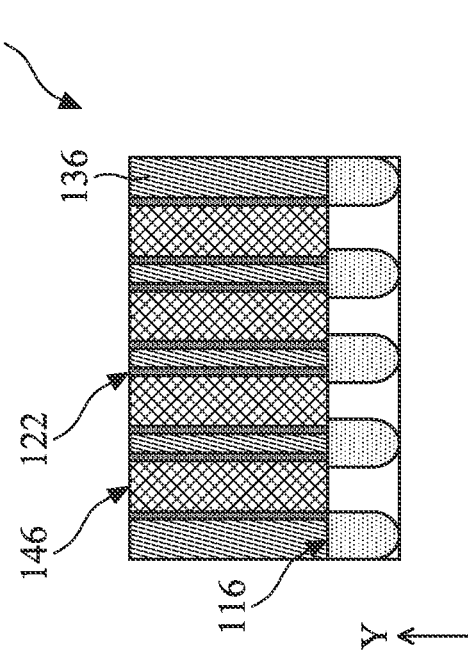
FIGS. 8A, 8B and 8C are a perspective and sectional views of the semiconductor structure at a fabrication stage, constructed according to various aspects of the present disclosure in some embodiments.
Figure 8B:
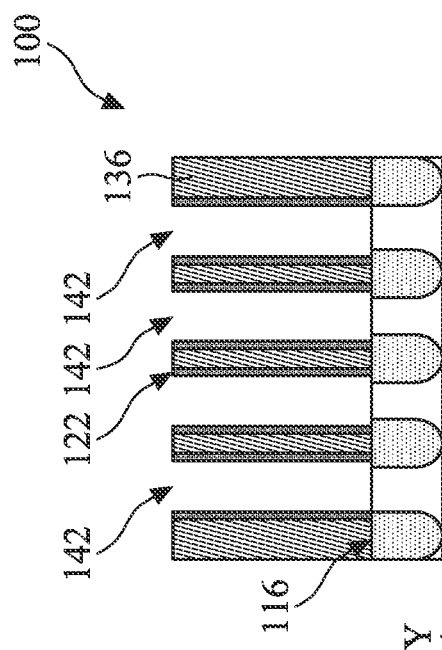
Figure 8C:
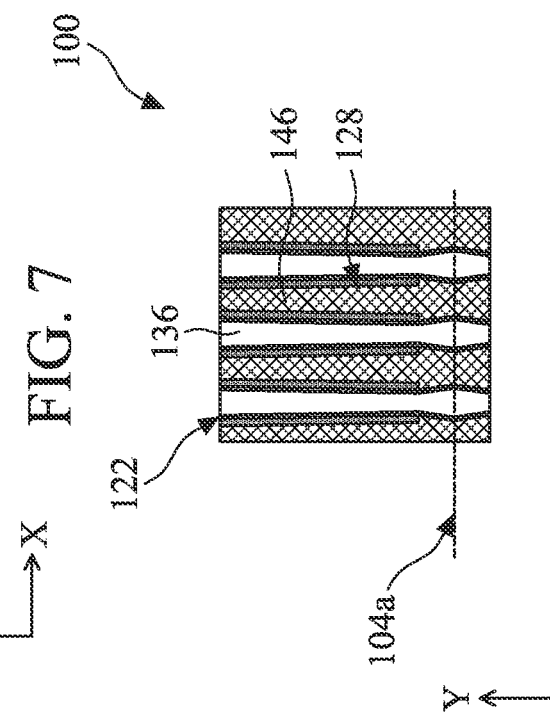

Referring to FIGS. 8A, 8B and 8C, the method 200 proceeds to an operation 212 by filling various gate material layers in the gate trench 142, thereby forming a metal gate stack 146 in the gate trench 142. FIG. 8A illustrates the semiconductor structure 100 in a perspective view, FIG. 8B is a sectional view of the semiconductor structure 100 cut over the isolation feature 108, and FIG. 8C is a sectional view of the semiconductor structure 100 cut over the fin active region 104. Especially, in some embodiments, the treated surface layer 128 is not removed and is present in the final gate stack 146. In this case, the treated surface layer 128 is inserted between the gate stack 146 and the gate spacer 122. The treated surface layer 128 extends from the top surface of the gate stack and is absent from the portions below 104a. The treated surface layer 128 is different from the gate stack 146 and the ILD layer 136 in composition. In the depicted embodiment, the gate stack 146 includes a high-k dielectric layer and various metal layers surrounded by the high-k dielectric layer (will be further described layer); the ILD layer 136 includes an etch stop layer (such as silicon nitride), silicon oxide or a low-k dielectric layer surround by the etch stop layer; and the treated surface layer 128 includes silicon, carbon and nitrogen.

The gate stack 146 is further described with reference to FIGS. 12A and 12B in sectional views. In some embodiments such as in high-k last process, the gate material layers include a gate dielectric layer 150 and a gate conductive layer (or gate electrode) 152. The gate dielectric layer 150 includes a high-k dielectric material that may include metal oxides, metal nitrides, metal silicates, transition metal-oxides, transition metal-nitrides, transition metal-silicates, oxynitrides of metals, metal aluminates, zirconium silicate, or zirconium aluminate, such as $HfO_2$, $ZrO_2$, $ZrO_xN_y$, $HfO_xN_y$, $HfSi_xO_y$, $ZrSi_xO_y$, $HfSi_xO_yN_z$, $ZrSi_xO_yN_z$, $Al_2O_3$, $TiO_2$, $Ta_2O_5$, $La_2O_3$, $CeO_2$, $Bi_4Si_2O_{12}$, $WO_3$, $Y_2O_3$, $LaAlO_3$, $Ba_{1-x}Sr_xTiO_3$, $PbTiO_3$, $BaTiO_3$, $SrTiO_3$, $PbZrO_3$, PST, PZN, PZT, PMN, and combinations thereof.

The gate conductive layer 152 includes metal. In some embodiments, the gate conductive layer 152 include multiple layers, such as a capping layer, a work function metal layer, a blocking layer and a filling metal layer (such as aluminum or tungsten). The gate material layers may further include an interfacial layer 148, such as silicon oxide, interposed between the active region 104 and the high-k dielectric material. The interfacial layer 148 is a portion of the gate dielectric layer. The various gate material layers are filled in the gate trench 142 by deposition, such as CVD, physical vapor deposition (PVD), plating, atomic layer deposition (ALD) or other suitable techniques.

The high-k dielectric layer 150 includes a dielectric material having the dielectric constant higher than that of thermal silicon oxide, about 3.9. The high k dielectric layer 150 is formed by a suitable process such as ALD. Other methods to form the high k dielectric material layer include metal organic chemical vapor deposition (MOCVD), PVD, or UV-Ozone Oxidation. In one embodiment, the high k dielectric material includes HfO2. Alternatively, the high k dielectric material layer 150 includes metal nitrides, metal silicates or other metal oxides.

In one embodiment illustrated in FIG. 12A in a sectional view, the gate electrode 152 includes a capping layer 152A, a blocking layer 152B, a work function metal layer 152C, another blocking layer 152D and a filling metal layer 152E. In furtherance of the embodiments, the capping layer 152A includes titanium nitride, tantalum nitride, or other suitable material, formed by a proper deposition technique such as ALD. The blocking layer 152B includes titanium nitride, tantalum nitride, or other suitable material, formed by a proper deposition technique such as ALD.

The work functional metal layer 152C includes a conductive layer of metal or metal alloy with proper work function such that the corresponding FET is enhanced for its device performance. The work function (WF) metal layer 152C is different for a pFET and a nFET, respectively referred to as an n-type WF metal and a p-type WF metal. The choice of the WF metal depends on the FET to be formed on the active region 104. For example, the semiconductor structure 100 includes a first active region 104 for an nFET and another active region for a pFET, and accordingly, the n-type WF metal and the p-type WF metal are respectively formed in the corresponding gate stacks. Particularly, an n-type WF metal is a metal having a first work function such that the threshold voltage of the associated nFET is reduced. The n-type WK metal is close to the silicon conduction band energy (Ec) or lower work function, presenting easier electron escape. For example, the n-type WF metal has a work function of about 4.2 eV or less. A p-type WF metal is a metal having a second work function such that the threshold voltage of the associated pFET is reduced. The p-type WF metal is close to the silicon valence band energy (Ev) or higher work function, presenting strong electron bonding energy to the nuclei. For example, the p-type work function metal has a WF of about 5.2 eV or higher.

In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. The n-type WF metal may include various metal-based films as a stack for optimized device performance and processing compatibility. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The p-type WF metal may include various metal-based films as a stack for optimized device performance and processing compatibility. The work function metal is deposited by a suitable technique, such as PVD.

The blocking layer 152D includes titanium nitride, tantalum nitride, or other suitable material, formed by a proper deposition technique such as ALD. In various embodiments, the filling metal layer 152E includes aluminum, tungsten or other suitable metal. The filling metal layer 152E is deposited by a suitable technique, such as PVD or plating.

In some embodiments, the gate stack 146, as illustrated in FIG. 12A, is formed by the high-k last process, the high-k dielectric material layer 150 is U-shaped. Alternatively, the gate stack 146 is formed in the high-k first process, the high-k dielectric material layer 150 (and the interfacial layer 148 as well) is formed with the dummy gate stack 110' and remains in the metal gate stack 146. In this case, the high-k dielectric material layer 150 is shaped differently, as illustrated in FIG. 12B.

The method 200 includes other fabrication operation 214, implemented before, during or after the above operations. For examples, the operation 214 includes forming an interconnect structure that includes various conductive features, such as contacts, metal lines and vias to electrically connect various features (such as gate electrode and S/D features) to form an integrated circuit. An interconnect structure is formed on the substrate and is designed to couple various transistors and other devices to form a functional circuit. The interconnect structure includes various conductive features, such as metal lines for horizontal connections and contacts/vias for vertical connections. The various interconnect features may implement various conductive materials including copper, tungsten and silicide. In one example, a damascene process is used to form copper-based multilayer interconnect structure. In another embodiment, tungsten is used to form tungsten plug in the contact holes.

Referring to FIGS. 9A, 9B, 9C, 9D, 9E and 9F in a top view, perspective view or sectional view, respectively, the gate stack 146 is further described with its shape and profile. More particularly, FIG. 9A is a top view of the semiconductor structure 100 illustrating the gate stacks 146 and the fin active regions 104. FIG. 9B is a perspective view of the semiconductor structure 100 illustrating the gate stacks 146, the fin active regions 104, and the isolation features 108. FIG. 9C is a top view of a portion 156 of the semiconductor structure 100 illustrating the gate stacks 146 and the fin active regions 104. FIG. 9D is a perspective view of the semiconductor structure 100 illustrating the gate stacks 146. Especially, the gate stack 146 includes a segment 158 in a spacing between the adjacent fin active regions 104. In some embodiment, the S/D features 116 in the adjacent fin active regions 104 are merged together, as illustrated by an exemplary S/D feature 116 in FIG. 9A. FIG. 9E is a top view of the gate stack 146 in that segment 158 and FIG. 9F is a sectional view of the gate stack 146 in the segment 158.

The gate stack 146 formed by the disclosed method has an uneven profile in a top view as illustrated in FIG. 9C. The gate stack 146 has a varying dimension (along the X direction) from the edge of one fin active region 104 to the edge of another active region 104 with the minimum at the middle between the two fin active regions. The gate stack 146 also has an uneven profile in a cross-section, as illustrated in FIG. 9F. The gate stack 146 has a varying dimension (along the X direction) from the top surface to the bottom surface with the minimum at a height leveling the top surface 104a of the fin active regions 104.

As illustrated in FIG. 9F, the gate stack 146 has an uneven shape in a sectional view, spanning three dimensions $D_1$, $D_2$ and $D_3$ at different levels. Particularly, the gate stack 146 spans the first dimension $D_1$ at the top surface, the second dimension $D_2$ at the bottom surface and the third dimension $D_3$ as a minimum dimension at a location leveling the top surface 104a of the fin active region 104. Each of $D_1$ and $D_2$ is greater than $D_3$. In the depicted embodiment, the second dimension $D_2$ is greater than the first dimension $D_1$. In some embodiments, those dimensions define various ratios. A first ratio $D_1/D_3$ ranges between about 1.4 and about 1.6; and a second ratio $D_2/D_3$ ranges between about 1.7 and about 1.9 according to some embodiments. In the present embodiment, the heights of various portions of the gate stack 146 in FIG. 9F carry the corresponding heights from the gate stack 110' in FIG. 4F. For example, the upper portion between $D_1$ and $D_3$ corresponds to the upper portion 110a with a height $H_1$; the middle portion between $D_3$ and $D_2$ corresponds to the middle portion 110b with a height $H_2$; and the lower portion below $D_2$ corresponds to the lower portion 110c with a height $H_3$. The height ratios remain in the gate stack 14 according to the present embodiment. For example, the ratio $H_1/H_2$ ranges between 2.5 and 3.5 and the ratio $H_2/H_3$ ranges between 1.5 and 2.

The segment 156 in a spacing between the first and second adjacent fin active regions 104 has an uneven shape in a top view, as illustrated in FIGS. 9C and 9E. The uneven shape is referred to as a gourd shape. The gate stack 146 in that segment 156 spans along the X direction a fourth dimension $D_4$ at an edge of the first fin active region, a fifth dimension $D_5$ at an edge of the second fin active region, a sixth dimension $D_6$ at a middle location between the edges of the first and second fin active regions. Each of the fourth dimension $D_4$ and the fifth dimension $D_5$ is less than the sixth dimension $D_6$. Furthermore, the fifth dimension $D_5$ is equal to the fourth dimension $D_4$ such that the shape is symmetric and has a minimum dimension $D_6$ in the middle. In some embodiments, a ratio $D_6/D_4$ ranges between about 0.7 and about 0.9.

By the disclosed method 200 and the semiconductor structure 100 made by the method 200, the gate stack 146 has a well-designed shape, the corresponding transistor and the circuit has enhanced circuit performance (such as ring oscillator performance) and production yield. More particularly, the gourd shape of the gate stack 146 in the top view provides device performance gains including reduced parasitic capacitance by reduced $D_6$ and enhanced gate control by increased $D_4$ and $D_5$. This is because the middle portion of the gate associated with $D_6$ in the top view contributes to the capacity but has no or minimal contribution to the gate control and reducing its dimension can reduce the parasitic capacitance without compromising the coupling between the gate and the channel. The edges portions of the gate associated with $D_4$ and $D_5$ have increased dimensions, which brings the benefits that include increased channel length, therefore increases the coupling between the gate and the channel. The hourglass shape of the gate stack 146 in the sectional view provides various performance enhancements and improved gate control. Particularly, wider size at the bottom provides device performance gain by reducing drain-induced barrier lowering (DIBL) and by reducing fin bottom leakage; narrow size at the middle reduces parasitic capacitance; and wide size at the top increases gate fill window with increased yield gain.

Referring to FIGS. 10A, 10B, 10B', 10C, 10C', 10D and 10E in a top view or sectional view, respectively, the gate stack 146 in the portion 156 is further described according to various embodiments. By tuning various etching process at the operation 204, other profiles of the gate stack 146 can be achieved, such as those illustrated in FIGS. 10B through 10E. The gate stack 146 in the segment 156 has different shapes and dimensions. Those shapes and dimensions are achieved by tuning various processing parameters of the operation 204, especially the etching times and the etchants of the second etching process 228 and the third etching process 230. Different shapes and dimensions of the gate stack 146 may be used to form particular devices for performance enhancement and/or to compensate device characteristic variations, depending on individual application.

In one embodiment, the gate stack 146 in the segment 156 has a sectional view as illustrated in FIG. 10B and a top view as illustrated in FIG. 10B'. This is similar to the structure described in FIGS. 9A~9D. The gate stack 146 has an uneven profile with a narrow waist. Especially, the gate stack 146 spans three dimensions C, D and E at different levels. A first ratio C/D ranges between about 1.4 and about 1.6; and a second ratio E/D ranges between about 1.7 and about 1.9 according to some embodiments.

In another embodiment, the gate stack 146 in the segment 156 has a sectional view as illustrated in FIG. 10C and a top view as illustrated in FIG. 10C'. The gate stack 146 has an uneven profile with an increasing dimension from the bottom surface to the top surface. Especially, the gate stack 146 spans dimensions F and D at the top surface and the bottom surface, respectively. A ratio F/G ranges between about 1.1 and about 1.4.

In yet another embodiment, the gate stack 146 in the segment 156 has a sectional view as illustrated in FIG. 10D. The gate stack 146 has an uneven profile with a decreasing dimension from the bottom surface to the top surface. Especially, the gate stack 146 spans dimensions H and I at the top surface and the bottom surface, respectively. A ratio I/H ranges between about 1.4 and about 1.6.

In yet another embodiment, the gate stack 146 in the segment 156 has a sectional view as illustrated in FIG. 10E. The gate stack 146 has an uneven profile with a wider waist. Especially, the gate stack 146 spans dimensions J, K and L at the top surface, at a height leveling with the top surface of the fin, and at the bottom surface, respectively. A first ratio K/J ranges between about 1.4 and about 1.6; and a second ratio K/L ranges between about 1.4 and about 1.6.

The semiconductor structure 100 may be formed on a structure having vertically-stacked multiple channels, such as one illustrated in FIG. 13. FIG. 13 is a sectional view of the semiconductor structure 100, in portion, constructed in accordance with some embodiments. In FIG. 13, the integrated circuit 100 has a vertically-stacked channel structure, in which multiple channels are vertically stacked. Especially, the semiconductor structure 100 includes a substrate 602 and multiple channels 604 formed over the substrate 602. The semiconductor structure 100 further includes a gate stack 606 formed around the channels 604 and source/drain (S/D) features 608 disposed on both sides of the gate stack 606. Particularly, the gate stack 606 wraps around each of the vertically-stacked multiple channels 604 that span between the S/D features 608 disposed on the both sides of the gate stack 606. The semiconductor structure 100 further includes other features, such as inner spacers 610 (of one or more dielectric material) interposed between the gate stack 606 and the S/D features 608; gate spacers 612 disposed on sidewalls of the gate stack 606; a doped wall 614 (such as an N-well or a P-well); and an interlevel dielectric (ILD) layer 616. The gate stack 606 includes a gate dielectric layer and a gate electrode. The gate dielectric layer includes one or more dielectric material, such as a high-k dielectric material. The gate dielectric layer may further include an interfacial layer (such as silicon oxide) underlying the high-k dielectric material. The gate electrode includes one or more conductive material, such as a capping layer, a work functional metal and a fill metal. Particularly, the gate stack 606 is similar to the gate stack 146 with the geometry described above and is formed in a similar way. For example, the portion of the gate stack 606 above the multiple channels 604 has a shape similar to that of the gate stack 146.

The present disclosure is not limited to applications in which the semiconductor structure includes a filed effect transistor, such as a metal-oxide-silicon (MOS) transistor, and may be extended to other integrated circuit having a metal gate stack. For example, the semiconductor structure 100 may include a logic circuit, analog circuit, imaging sensor circuit, a static random-access memory (SRAM) cell, a dynamic random-access memory (DRAM) cell, a single electron transistor (SET), and/or other microelectronic devices (collectively referred to herein as microelectronic devices). Of course, aspects of the present disclosure are also applicable and/or readily adaptable to other type of transistor, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. In one embodiment, the gate electrode may alternatively or additionally include other suitable metal. The footing procedure may implement other effective cleaning procedure. The disclosed method is used to but not limited to form one transistor, such as an n-type metal-oxide-semiconductor field-effect-transistor (nMOSFET). For example, a plurality of nMOSFETs and a plurality of p-type metal-oxide-semiconductor field-effect-transistors (pMOSFETs) are formed in the same substrate, the nMOSFETs and pMOSFETs are formed in a collective procedure where some features are respectively formed. In a particular example, the n-type WF metal is formed in the nMOSFET regions while pMOSFET regions are covered from the deposition of n metal.

In another embodiment, the semiconductor substrate may include an epitaxial layer. For example, the substrate may have an epitaxial layer overlying a bulk semiconductor. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method.

The present disclosure provides a semiconductor structure and method making the same. The semiconductor structure 100 includes a gate stack 146 with an uneven shape. The gate stack has an hourglass shape in a sectional view and the segment between two adjacent fin active regions 104 has a gourd shape in a top view.

Various advantages may present in one or more embodiments of the method 200 and the semiconductor structure 100. By the disclosed method 200 and the semiconductor structure 100 made by the method 200, the gate stack 146 has a well-designed shape, the corresponding transistor and the circuit has enhanced device performance and production yield. More particularly, the gourd shape of the gate stack 146 in the top view provides device performance gains including reduced parasitic capacitance and enhanced gate control while the hourglass shape of the gate stack 146 in the sectional view provides reduced drain-induced barrier lowering (DIBL) with increased device performance gain and increased gate fill window with increased yield gain.

In one aspect, the present disclosure provides a semiconductor structure that includes a semiconductor substrate; fin active regions protruded above the semiconductor substrate; and a gate stack disposed on the fin active regions; wherein the gate stack includes a high-k dielectric material layer, and various metal layers disposed on the high-k dielectric material layer. The gate stack has an uneven profile in a sectional view with a first dimension $D_1$ at a top surface, a second dimension $D_2$ at a bottom surface, and a third dimension $D_3$ at a location between the top surface and the bottom surface, and wherein each of $D_1$ and $D_2$ is greater than $D_3$.

In another aspect, the present disclosure provides a semiconductor structure that includes a semiconductor substrate; a first and second fin active regions formed on the semiconductor substrate; surrounded by an isolation feature and protruded above the isolation feature, wherein the first and second fin active regions are oriented in a first direction and are spaced away in a second direction that is substantially orthogonal to the first direction; and a gate stack oriented in the second direction and extending over the first and second fin active regions. The gate stack includes a segment in a spacing between the first and second fin active regions. The segment of the gate stack has an hourglass shape in a sectional view and a gourd shape in a top view.

In yet another aspect, the present disclosure provides a method of forming a semiconductor structure. The method includes forming fin active regions on a semiconductor substrate; depositing a gate material layer on the fin active regions and the semiconductor substrate; performing a first etching process to the gate material layer, thereby forming a patterned gate material layer; performing a surface modification by implantation to sidewalls of the patterned gate material layer; and thereafter, performing a second etching process to the patterned gate material layer to form a patterned gate stack.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
a semiconductor substrate;
fin active regions protruded above the semiconductor substrate; and
a gate stack disposed on the fin active regions, wherein the gate stack includes a high-k dielectric material layer, and various metal layers disposed on the high-k dielectric material layer, wherein the gate stack includes an uneven profile in a sectional view with a first dimension $D_1$ at a top surface, a second dimension $D_2$ at a bottom surface, and a third dimension $D_3$ at a location between the top surface and the bottom surface, and wherein each of $D_1$ and $D_2$ is greater than $D_3$, wherein the gate stack includes a segment disposed on a shallow trench isolation feature and interposed between the first and second fin active regions, and wherein the segment of the gate stack has an uneven shape in a top view.

2. The semiconductor structure of claim 1, wherein the third dimension $D_3$ is a minimum dimension at the location leveling a top surface of the fin active regions.

3. The semiconductor structure of claim 2, wherein the second dimension $D_2$ is greater than the first dimension $D_1$.

4. The semiconductor structure of claim 3, wherein a first ratio $D_1/D_3$ ranges between about 1.4 and about 1.6; and a second ratio $D_2/D_3$ ranges between about 1.7 and about 1.9.

5. The semiconductor structure of claim 1, wherein
the fin active regions include a first and second fin active regions oriented in a first direction and spaced away in a second direction that is substantially orthogonal to the first direction;
the gate stack is extending over the first and second fin active regions along the second direction; and
the first, second and third dimensions are measured along the second direction.

6. The semiconductor structure of claim 1, wherein the segment of the gate stack, in a top view, spans along the first direction a fourth dimension $D_4$ at an edge of the first fin active region, a fifth dimension $D_5$ at an edge of the second fin active region, a sixth dimension $D_6$ at a middle location between the edges of the first and second fin active regions, and wherein each of the fourth dimension $D_4$ and the fifth dimension $D_5$ is less than the sixth dimension $D_6$.

7. The semiconductor structure of claim 6, wherein the fifth dimension $D_5$ is equal to the fourth dimension $D_4$.

8. The semiconductor structure of claim 7, wherein a ratio $D_4/D_6$ ranges between about 0.7 and about 0.9.

9. The semiconductor structure of claim 1, wherein the segment of the gate stack has an hourglass shape in a sectional view.

10. A semiconductor structure, comprising:
a semiconductor substrate;
a first and second fin active regions formed on the semiconductor substrate; surrounded by an isolation feature and protruded above the isolation feature, wherein the first and second fin active regions are oriented in a first direction and are spaced away in a second direction that is substantially orthogonal to the first direction; and
a gate stack oriented in the second direction and extending over the first and second fin active regions, wherein
the gate stack includes a segment in a spacing between the first and second fin active regions, and
the segment of the gate stack has an hourglass shape in a sectional view and a gourd shape in a top view.

11. The semiconductor structure of claim 10, wherein the segment of the gate stack spans along the second direction a first dimension $D_1$ at a top surface, a second dimension $D_2$ at a bottom surface, and a third dimension $D_3$ at a location between the top surface and the bottom surface, and wherein each of $D_1$ and $D_2$ is greater than $D_3$.

12. The semiconductor structure of claim 11, wherein
the third dimension $D_3$ is a minimum dimension at the location leveling a top surface of the fin active regions; and
the second dimension $D_2$ is greater than the first dimension $D_1$.

13. The semiconductor structure of claim 12, wherein a first ratio $D_1/D_3$ ranges between about 1.4 and about 1.6; and a second ratio $D_2/D_3$ ranges between about 1.7 and about 1.9.

14. The semiconductor structure of claim 10, wherein
the segment of the gate stack, in a top view, spans along the first direction a fourth dimension $D_4$ at an edge of the first fin active region, a fifth dimension $D_5$ at an edge of the second fin active region, a sixth dimension $D_6$ at a middle location between the edges of the first and second fin active regions;
each of the fourth dimension $D_4$ and the fifth dimension $D_5$ is less than the sixth dimension $D_6$; and
the fifth dimension $D_5$ is equal to the fourth dimension $D_4$.

15. The semiconductor structure of claim 14, wherein a ratio $D_4/D_6$ ranges between about 0.7 and about 0.9.

16. A semiconductor structure, comprising:
a semiconductor substrate;
fin active regions protruded above the semiconductor substrate; and
a gate stack disposed on the fin active regions, wherein the gate stack includes a high-k dielectric material layer, and various metal layers disposed on the high-k dielectric material layer, wherein the gate stack includes an uneven profile in a sectional view with a first dimension $D_1$ at a top surface, a second dimension $D_2$ at a bottom surface, and a third dimension $D_3$ at a location between the top surface and the bottom surface, and wherein each of $D_1$ and $D_2$ is greater than $D_3$, wherein the second dimension $D_2$ is greater than the first dimension $D_1$.

17. The semiconductor structure of claim 16, wherein
the third dimension $D_3$ is a minimum dimension at the location leveling a top surface of the fin active regions;
a first ratio $D_1/D_3$ ranges between about 1.4 and about 1.6; and
a second ratio $D_2/D_3$ ranges between about 1.7 and about 1.9.

18. The semiconductor structure of claim 16, wherein
the fin active regions include a first and second fin active regions oriented in a first direction and spaced away in a second direction that is substantially orthogonal to the first direction;
the gate stack is extending over the first and second fin active regions along the second direction; and
the first, second and third dimensions are measured along the second direction.

19. The semiconductor structure of claim 18, wherein the gate stack includes a segment disposed on a shallow trench isolation feature and interposed between the first and second fin active regions, and wherein the segment of the gate stack has an uneven shape in a top view.

20. The semiconductor structure of claim 19, wherein
the segment of the gate stack, in a top view, spans along the first direction a fourth dimension $D_4$ at an edge of the first fin active region, a fifth dimension $D_5$ at an edge of the second fin active region, a sixth dimension $D_6$ at a middle location between the edges of the first and second fin active regions;

each of the fourth dimension $D_4$ and the fifth dimension $D_5$ is less than the sixth dimension $D_6$; and the fifth dimension $D_5$ is equal to the fourth dimension $D_4$.

* * * * *